(12) United States Patent
Ueoka

(10) Patent No.: US 6,468,893 B2
(45) Date of Patent: Oct. 22, 2002

(54) METHOD OF FORMING SOLDER BUMPS

(75) Inventor: Yoshito Ueoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/047,172

(22) Filed: Oct. 23, 2001

(65) Prior Publication Data

US 2002/0064933 A1 May 30, 2002

(30) Foreign Application Priority Data

Oct. 27, 2000 (JP) ........................................ 2000-329297

(51) Int. Cl.⁷ .............................................. H01L 21/44
(52) U.S. Cl. ........................ 438/612; 438/613; 438/614
(58) Field of Search ................................. 438/612, 613, 438/614

(56) References Cited

U.S. PATENT DOCUMENTS

| | | | |
|---|---|---|---|
| 5,212,216 A | | 5/1993 | Hattori et al. |
| 5,908,317 A | * | 6/1999 | Heo .......................... 438/617 |
| 6,100,475 A | * | 8/2000 | Degani et al. .............. 438/613 |
| 6,145,011 A | | 11/2000 | Furukawa et al. |
| 6,159,837 A | * | 12/2000 | Yamanji et al. ............. 438/613 |
| 6,165,885 A | * | 12/2000 | Gaynes et al. ............... 438/612 |
| 6,264,097 B1 | * | 7/2001 | Sano .......................... 438/613 |
| 6,348,401 B1 | * | 2/2002 | Chen et al. .................. 438/614 |
| 2001/0040290 A1 | * | 11/2001 | Sakurai et al. .............. 438/613 |
| 2002/0031868 A1 | * | 3/2002 | Capote et al. ............... 438/612 |

FOREIGN PATENT DOCUMENTS

| | | |
|---|---|---|
| JP | 11-040936 | 2/1999 |
| JP | 11-145176 | 5/1999 |

* cited by examiner

Primary Examiner—Jey Tsai
Assistant Examiner—Lynne A. Gurley

(57) ABSTRACT

A method of forming solder bumps comprises the steps of (a), forming first solder paste layers on respective electrodes/pads of a substrate by printing a solder paste on the electrodes/pads using a first mask, (b) forming first solder bumps on the respective electrodes/pads by melting the first solder paste layers and solidifying the first solder paste layers, after removing the first mask, (c) forming second solder paste layers on the respective first solder bumps by printing a solder paste on the first solder bumps using a second mask and (d) forming second solder bumps on the respective electrodes/pads by melting the first solder bumps and the second solder paste layers to be integrated together and by solidifying the first solder bumps and the second solder paste layers, after removing the second mask.

12 Claims, 7 Drawing Sheets

METHOD OF FORMING SOLDER BUMPS

BACKGROUND OF THE INVENTION

1. Field of the Invention

The present invention relates to a method of forming solder bumps. More particularly, the invention relates to a method of forming solder bumps that realizes formation of solder bumps with a desired height on electrodes or pads of an object to be connected, such as a substrate, a LSI (Large-Scale Integration) bare chip, and an electronic component, while suppressing or preventing generation of the defect of voids in solder bumps formed.

2. Description of the Related Art

The "flip-chip bonding" method, which is known well, is typically used to interconnect a LSI bare chip (which may be termed a "LSI chip" or "bare chip", hereinafter) to a mounting substrate. In this method, "solder bumps" (which are typically approximately spherical projections of solder) are formed on the electrodes or bonding pads of a LSI bare chip. Then, the solder bumps are opposed and joined to the corresponding electrodes or pads of a mounting substrate, thereby connecting electrically and mechanically the bumps on the chip to the corresponding electrodes or pads of the substrate. Thus, the bare chip is fixed or mounted on the substrate in its face-down state.

The flip-chip bonding method may be applicable to mounting and connection of other electronic elements and/or components than LSI bare chips. In this case, the solder bumps are formed on the electrodes (i.e., lands) of a mounting board (e.g., a Printed Wiring Board (PWB)) or the terminals or electrodes of an electronic element or component.

Conventionally, various types of method of forming solder bumps have been known, which are divided into several groups corresponding to the technique used therein. For example, one of the groups uses a solder layer formed by a plating or evaporating process of a solder material. Another one of the groups uses the placement of solder balls on the electrodes. Still another one of the groups uses a solder paste layer formed by a printing process. Recently, there is a method using "metal jet". Solder layers or solder balls, which are formed or placed on the electrodes by one of these methods, are temporarily melted due to heat in a reflowing furnace, forming molten solder pieces on the electrodes. These molten solder pieces are likely to be round or projective due to their surface tension and thus, the molten solder pieces are cooled to solidify naturally as they are. As a result, approximately spherical or projective solder bumps are formed on the electrodes.

These types of method have their own advantages and disadvantages and therefore, it is usual that one of them is selected and used according to the purpose.

From the viewpoint of fabrication cost, it is most preferred to select the type of method using a printed solder paste layer as preliminary solder pieces. This is because the preliminary solder pieces are formed by a screen printing process and thus, the method can be conducted with simple facilities and the fabrication cost can be reduced easily.

However, the type of method using a solder paste layer has a disadvantage that an obtainable height of solder bumps is smaller than the other types. This is due to the fact that the amount of solder to be placed on each electrode or pad has to be limited to a low level through one printing process in order to prevent the defect termed "solder bridge" and "deviation or fluctuation of solder amount". On the other hand, if the height of solder bumps is insufficient, defective connection of the solder bumps to the corresponding electrodes or pads tends to occur because of the surface irregularity and/or thermal deformation of the substrate. Accordingly, some contrivance is necessary to realize solder bumps with desired, sufficient height without any defects.

The type of method using a solder paste layer has another disadvantage that a defect termed "void" is likely to be formed in solder bumps. This is because a solder paste is mainly made of solder particles and a flux and therefore, it has less wettability to the electrodes or pads than that of the other types of method. If a void occurs in a solder bump, the effective connection area of the bump to the electrode or pad decreases largely and at the same time, stress concentration occurs in the neighborhood of the void. As a result, there arises a serious problem of degradation of mounting or interconnection reliability.

As explained above, with the conventional method of forming solder bumps using screen printing, some measure needs to be taken to form void-free, good-quality solder bumps with a sufficient height while making use of the advantage of low cost. To provide such measure, various improvements have ever been studied and developed for this method.

The Japanese Non-Examined Patent Publication No. 11-40936 published in 1999 discloses an improved method of forming solder bumps. In this method, a patterned solder paste layer is formed on a substrate by printing using a metal mask (i.e., the printing step) and then, the solder paste layer is reflown (i.e., the reflowing step). The printing and reflowing steps are repeated according to the necessity to obtain solder bumps with a desired height. As a result, even if conventional mounting facilities are used, there arises no defects such as "solder bridge" caused by the excessive openings of the mask and/or "solder amount dispersion" caused by bad detachment behavior of the mask from the substrate due to the excessive thickness of the mask. This means that the resultant solder bumps have a desired height and are uniform in size.

In the prior-art method disclosed by the Publication No. 11-40936, if necessary, when the combination of the printing and reflowing steps is repeated, the thickness of the metal mask and/or the diameter and/or shape of the openings of the mask may be changed. Moreover, the composition and/or characteristics of the solder paste used may be varied, and the process condition of the printing or reflowing step may be changed, according to the necessity.

The Japanese Non-Examined Patent Publication No. 11-145176 published in 1999 discloses another improved method of forming solder bumps using screen printing. In this method, a patterned solder paste layer is formed by printing on a substrate using a mask with openings (i.e., the printing step) and then, the solder paste layer is heated and melted temporarily, forming a solder bump layer (the heating step). The combination of the printing and heating steps is defined as a "bump layer formation cycle". The bump layer formation cycle is repeated as necessary to form solder bumps with a desired height.

In the prior-art method of forming solder bumps disclosed by the Publication No. 11-145176, if necessary, a flattening step of flattening the upper face of the solder bump layer may be added. When the bump layer formation cycle is repeated, the thickness of the mask, the property and/or fluidity of the solder paste used, or the area or size of the openings of the mask may be changed.

The above-described Publication No. 11-145176 further discloses a method of forming preliminary solder pieces. This method is used to form preliminary solder pieces on a mounting substrate on which an object (e.g., a LSI chip) with solder bumps is to be mounted by the flip-chip bonding method. A resist film with openings at the connection points for the solder bumps is formed on the substrate. The preliminary solder pieces are placed at the connection points. In this method, a patterned solder paste layer is formed on the substrate by printing using a mask with openings at the connection points (i.e., the printing step) and then, the solder paste layer is heated and melted temporarily (i.e., the heating step), thereby forming preliminary solder pieces on the pads of the substrate. The openings of the mask used in the printing step are set to be larger in size or area than those of the resist film.

In the prior-art method forming preliminary solder pieces disclosed by the Publication No. 11-145176, the preliminary solder pieces are placed on the pads of the substrate on which an LSI chip is to be mounted. The preliminary solder pieces are formed to enhance the electrical connectivity between the pads on the substrate and the solder bumps of the LSI chip.

With the prior-art method of forming preliminary solder pieces disclosed by the Publication No. 11-145176, the openings of the mask used in the printing step are set to be larger in size or area than the resist film and therefore, the detachment behavior of the mask from the substrate after the printing step is finished is improved. As a result, the solder paste is prevented from being attached to the mask when the mask is detached from the substrate. This ensures the formation of the preliminary solder pieces with a desired shape.

In the prior-art method of forming preliminary solder pieces disclosed by the Publication No. 11-145176, a pressing step of pressing the solder paste filled into the openings of the resist film and those of the mask may be added. In this case, there is an advantage that the filling or packing property of the solder paste is improved. Moreover, if the diameter of the solder particles in the paste and the diameter of the openings of the mask have a specific relationship, there is an advantage that the filling or packing property of the solder paste is improved. When the mask is attached onto the substrate in the printing step, the mask may be located in such a way that the openings of the mask are shifted from their concentric positions with respect to the openings of the resist film. In this case, there is an advantage that the void defect is prevented from being formed in the preliminary solder pieces in the heating step.

As described above in detail, with the conventional method of forming solder bumps using screen printing, there is a problem that an obtainable height of solder bumps is insufficient and the void defect tends to occur in solder bumps, and that obtainable electrical and mechanical interconnection reliability is insufficient.

With the prior-art method of forming solder bumps disclosed by the Publication No. 11-40936, to obtain solder bumps with a desired height, the printing and reflowing steps are repeated according to the necessity to thereby place a specific amount of the solder paste on the substrate step by step. As a result, even if conventional mounting facilities are used, there arises no defect such as "solder bridge" and/or "solder amount dispersion", resulting in desired height and uniform size of the solder bumps. However, this method provides no consideration on prevention of the void defect that are likely to occur in solder bumps.

With the prior-art method of forming solder bumps disclosed by the Publication No. 11-145176, like the prior-art method disclosed by the Publication No. 11-40936, there is no consideration on prevention of the void defect that are likely to occur in solder bumps.

With the prior-art method of forming preliminary solder pieces disclosed by the Publication No. 11-145176, when the mask is attached or placed onto the substrate in the printing step, the mask may be located in such a way that the openings of the mask are shifted from their concentric positions with respect to the openings of the resist film. In this case, there is an advantage that the void defect is prevented from being formed in the preliminary solder pieces in the heating step. However, the disclosed reason for this advantage is that the air existing in minute holes or depressions generated by the surface irregularity of each pad is confined by the solder paste. If the mask is placed to be shifted that way, the air will be moved out of the holes or depressions when the molten solder flows onto the pad, thereby preventing the void defect.

With the prior-art method of forming preliminary solder pieces of the Publication No. 11-145176, however, the resist film with the openings needs to be formed on the mounting substrate and at the same time, the mask with the openings needs to be placed on the resist film. Moreover, the openings of the mask have to be shifted with respect to those of the resist film as described above. As a result, the method has a problem that it is unable to be applied to the formation of solder bumps on the electrodes of a LSI chip, and that the process itself of forming preliminary solder pieces is complicated. Additionally, this method is a method of forming preliminary solder pieces, not solder bumps.

SUMMARY OF THE INVENTION

Accordingly, an object of the present invention is to provide a method of forming solder bumps that makes it possible to form solder bumps with desired height while suppressing or preventing generation of the defect of voids in solder bumps.

Another object of the present invention is to provide a method of forming solder bumps that facilitates the prevention of the void defect in the solder bumps with a simple measure.

The above objects together with others not specifically mentioned will become clear to those skilled in the art from the following description.

According to a first aspect of the invention, a method of forming solder bumps is provided, which comprises the steps of:

(a) forming first solder paste layers on respective electrodes or pads of a substrate by printing a solder paste to have a specific pattern on the electrodes or pads using a first mask with openings;

(b) forming first solder bumps on the respective electrodes or pads of the substrate by melting the first solder paste layers due to heat for a while and by solidifying the first solder paste layers thus melted, after removing the first mask from the substrate;

(c) forming second solder paste layers on the respective first solder bumps over the electrodes or pads of the substrate by printing a solder paste to have a specific pattern on the first solder bumps using a second mask with openings; and (d) forming second solder bumps on the respective electrodes or pads of the substrate by melting the first solder bumps and the second solder paste layers due to heat for a while to be integrated together and by solidifying the first solder bumps and the second solder paste layers thus melted and integrated, after removing the second mask from the substrate;

the second solder bumps being larger than the first solder bumps;

wherein each of the openings of the first mask has a volume in such a way that each of the first solder bumps has a height approximately equal to maximum size of a void to be suppressed according to size of a corresponding one of the electrodes or pads.

With the method according to the first aspect of the invention, the above-described objects are achieved in the following way:

The inventor found, after his thorough investigation, that the main cause of the void defect in solder bumps is gaseous substances generated by reaction between electrodes/pads of a substrate and a solder paste placed thereon in the heating and reflowing process. In other words, he found that when molten solder paste pieces formed on the electrodes/pads solidify to become solder bumps after the heating and reflowing process, the gaseous substances thus generated are likely to be confined in these bumps. As a result, hollow spaces or cavities are formed within the bumps on the electrodes/pads. These spaces or cavities will be defective voids.

Furthermore, the inventor found that the more similar to a sphere the molten solder pieces are, the easier the gaseous substances are confined in the resultant bumps (i.e., the higher the possibility of voids becomes), and that the more similar to a sphere the pieces are, the larger the possible size or diameter of voids grows. This means that the more dissimilar to a sphere (the more similar to a plane) the pieces are, the lower the possibility of voids becomes and at the same time, the smaller the possible size of voids is. The invention was created based on this knowledge.

With the method according to the first aspect of the invention, each of the openings of the first mask has a volume in such a way that each of the first solder bumps has a height approximately equal to maximum size of a void to be suppressed according to size of a corresponding one of the electrodes or pads. Therefore, even if hollow spaces or cavities are formed within the first solder bumps on the respective electrodes/pads, the spaces or cavities that are approximately equal to the maximum size of the voids to be suppressed will burst and disappear easily.

There is a possibility that hollow spaces or cavities that are smaller than the maximum size of the voids to be suppressed are left in the first solder bumps. However, if the maximum size of the voids to be suppressed is set to be a suitable value, these smaller spaces or cavities can be dealt so as not to raise any practical problem.

As described above, the gaseous substances are generated by the reaction between different metallic materials (i.e., the electrodes and the solder paste) in the step (b) of forming the first solder bumps. Therefore, it can be said that such gaseous substances are not substantially generated in the step (d) of forming the second solder bumps, because the first solder bumps and the second solder paste layers (which are made of almost the same material) are melted and integrated together in the step (d). As a result, there is no limitation of the height of the second solder bumps formed in the step (d).

Accordingly, with the method of the first aspect of the invention, solder bumps with desired height can be formed on the respective electrodes/pads while suppressing or preventing generation of the defect of voids in the solder bumps. Moreover, since this method requires no special, additional process and no special printing condition of solder paste, it facilitates the prevention of the void defect in the solder bumps with a simple measure.

In addition, needless to say, the second solder paste layers may be contacted with the electrodes/pads at their side faces in the step (d). However, taking the shape and/or structure of the electrodes/pads into consideration, the possible contact areas between the electrodes/pads and the second solder paste layers in the step (d) are restricted within a sufficiently low level. As a result, even if a trace of gaseous substance is generated in the step (d), it can be ignored.

In a preferred embodiment of the method according to the first aspect, the first mask is thicker than the electrodes or pads of the substrate while the openings of the first mask are larger than the electrodes. Moreover, the second mask is thicker than the first mask while the openings of the second mask are larger than the corresponding openings of the first mask. In this embodiment, the advantages of the invention are more conspicuous.

In another preferred embodiment of the method according to the first aspect, the second solder bumps cover not only top faces of the respective electrodes or pads but also side faces thereof.

In still another preferred embodiment of the method according to the first aspect, each of the openings of the second mask has a volume in such a way that each of the second solder bumps has a height equal to a desired value.

According to a second aspect of the invention, another method of forming solder bumps is provided, which comprises the steps of:

(a) forming first solder paste layers on respective electrodes or pads of a substrate by printing a solder paste to have a specific pattern on the electrodes or pads using a first mask with openings;

(b) forming first solder bumps on the respective electrodes or pads of the substrate by melting the first solder paste layers due to heat for a while and solidifying the first solder paste layers thus melted, without removing the first mask from the substrate;

(c) forming a second mask with openings on the first mask;

(d) forming second solder paste layers on the respective first solder bumps over the electrodes or pads of the substrate by printing a solder paste to have a specific pattern on the first solder bumps using the second mask;

(e) forming second solder bumps on the respective electrodes or pads of the substrate by melting the first solder bumps and the second solder paste layers due to heat for a while to be integrated together and by solidifying the first solder bumps and the second solder paste layers thus melted and integrated, without removing the first and second masks from the substrate;

the second solder bumps being larger than the first solder bumps; and (f) removing the second and first masks from the substrate after the step (e);

wherein each of the openings of the first mask has a volume in such a way that each of the first solder bumps has a height approximately equal to maximum size of a void to be suppressed according to size of a corresponding one of the electrodes or pads.

With the method according to the second aspect of the invention, each of the openings of the first mask has a volume in such a way that each of the first solder bumps has a height approximately equal to maximum size of a void to be suppressed according to size of a corresponding one of the electrodes or pads. Therefore, even if hollow spaces or cavities are formed within the first solder bumps on the respective electrodes/pads, the spaces or cavities that are approximately equal to the maximum size of the voids to be suppressed will burst and disappear easily.

There is a possibility that hollow spaces or cavities that are smaller than the maximum size of the voids to be suppressed are left in the first solder bumps. However, if the maximum size of the voids to be suppressed is set to be a suitable value, these smaller spaces or cavities can be dealt so as not to raise any practical problem.

As described above, the gaseous substances are generated by the reaction between different metallic materials (i.e., the electrodes and the solder paste) in the step (b) of forming the first solder bumps. Therefore, it can be said that such gaseous substances are not substantially generated in the step (e) of forming the second solder bumps, because the first solder bumps and the second solder paste layers (which are made of almost the same material) are melted and integrated together in the step (e). As a result, there is no limitation of the height of the second solder bumps formed in the step (e).

Accordingly, with the method of the second aspect of the invention, solder bumps with desired height can be formed on the respective electrodes/pads while suppressing or preventing generation of the defect of voids in the solder bumps. Moreover, since this method requires no special, additional process and no special printing condition of solder paste, it facilitates the prevention of the void defect in the solder bumps with a simple measure.

In addition, needless to say, the second solder paste layers may be contacted with the electrodes/pads at their side faces in the step (e). However, taking the shape and/or structure of the electrodes/pads into consideration, the possible contact areas in between the electrodes/pads and the second solder paste layers in the step (e) are restricted within a sufficiently low level. As a result, even if a trace of gaseous substance is generated in the step (e), it can be ignored.

In a preferred embodiment of the method according to the second aspect, the first mask is thicker than the electrodes or pads of the substrate while the openings of the first mask are larger than the corresponding electrodes or pads. Moreover, the openings of the second mask are approximately equal in size to the corresponding openings of the first mask.

In another preferred embodiment of the method according to the second aspect, the second solder bumps cover not only top faces of the respective electrodes or pads but also side faces thereof.

In still another preferred embodiment of the method according to the second aspect, sum of each of the openings of the second mask and a corresponding one of the openings of the first mask has a volume in such a way that each of the second solder bumps has a height equal to a desired value.

According to a third aspect of the invention, still another method of forming solder bumps is provided, which comprises the steps of:
(a) placing first solder balls on respective electrodes or pads of a substrate;
(b) forming first solder bumps on the respective electrodes or pads of the substrate by melting the first solder balls due to heat for a while and by solidifying the first solder balls thus melted;
(c) placing second solder balls on the respective first solder bumps over the electrodes or pads of the substrate; and
(d) forming second solder bumps on the respective electrodes or pads of the substrate by melting the first solder bumps and the second solder balls due to heat for a while to be integrated together and by solidifying the first solder bumps and the second solder balls thus melted and integrated;
the second solder bumps being larger than the first solder bumps;
wherein each of the first solder balls has a volume in such a way that each of the first solder bumps has a height approximately equal to maximum size of a void to be suppressed according to size of a corresponding one of the electrodes or pads.

With the method according to the third aspect of the invention, each of the first solder balls has a volume in such a way that each of the first solder bumps has a height approximately equal to maximum size of a void to be suppressed according to size of a corresponding one of the electrodes or pads. Therefore, even if hollow spaces or cavities are formed within the first solder bumps on the respective electrodes/pads, the spaces or cavities that are approximately equal to the maximum size of the voids to be suppressed will burst and disappear easily.

There is a possibility that hollow spaces or cavities that are smaller than the maximum size of the voids to be suppressed are left in the first solder bumps. However, if the maximum size of the voids to be suppressed is set to be a suitable value, these smaller spaces or cavities can be dealt so as not to raise any practical problem.

As described above, the gaseous substances are generated by the reaction between different metallic materials (i.e., the electrodes and the solder balls) in the step (b) of forming the first solder bumps. Therefore, it can be said that such gaseous substances are not substantially generated in the step (d) of forming the second solder bumps, because the first solder bumps and the second solder balls (which are made of almost the same material) are melted and integrated together in the step (d). As a result, there is no limitation of the height of the second solder bumps formed in the step (d).

Accordingly, with the method of the third aspect of the invention, solder bumps with desired height can be formed on the respective electrodes/pads while suppressing or preventing generation of the defect of voids in the solder bumps. Moreover, since this method requires no special, additional process and no special printing condition of solder paste, it facilitates the prevention of the void defect in the solder bumps with a simple measure.

In a preferred embodiment of the method according to the god third aspect, the second solder balls are larger in diameter than the corresponding electrodes or pads of the substrate.

In another preferred embodiment of the method according to the third aspect, the second solder bumps cover not only top faces of the respective electrodes or pads but also side faces thereof.

In still another preferred embodiment of the method according to the third aspect, each of the second solder balls has a volume in such a way that each of the second solder bumps has a height equal to a desired value.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
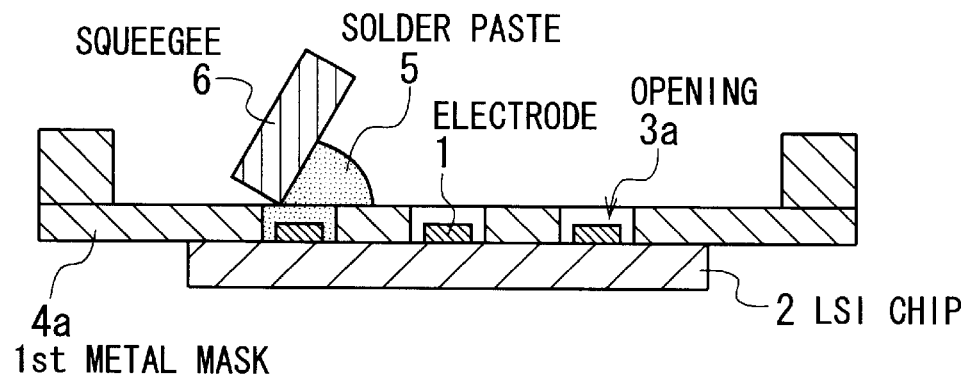
FIGS. 1A to 1F are schematic, partial cross-sectional views showing the process steps of a method of forming solder bumps according to a first embodiment of the invention, respectively.

Preferred embodiments of the present invention will be described in detail below while referring to the drawings attached.

First Embodiment

In a method of forming solder bumps according to a first embodiment, solder bumps are formed on the circular electrodes (i.e., bonding pads) 1 of a LSI bare chip 2, where the electrodes 1 are arranged on the surface of the chip 2 according to a specific layout. To simplify the explanation, it is supposed that all the electrodes 1 have the same diameter D1 and the same thickness T1. The diameter D1 of the electrodes 1 is, for example, 135 $\mu$m. It is needless to say that all or part the electrodes 1 may be different in shape and/or size from each other. Moreover, although a lot of electrodes 1 are formed on the chip 2, only three of them are shown in FIGS. 1A to 1F for simplicity.

Figure 4:
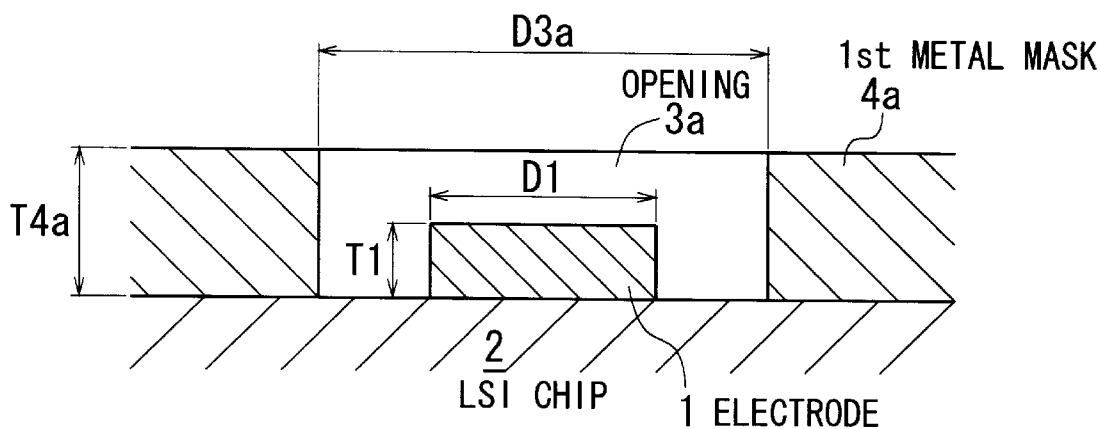
FIG. 4 is an enlarged, schematic, partial cross-sectional view showing the dimensional relationship between the opening of the first metal mask and the electrode of the substrate in the method according to the first embodiment of FIGS. 1A to 1F.

A first metal mask 4a to be used in this method has circular openings 3a at the corresponding locations to the electrodes 1 of the chip 2. The openings 3a are arranged according to the same layout as the electrodes 1. As shown in FIG. 4, the diameter D3a of each opening 3a is larger than the diameter D1 of the corresponding electrode 1 (i.e., D3a>D1) while the thickness T4a (i.e., the height of the openings 3a) of the mask 4a is larger than the thickness T1 of the electrodes 1 (i.e., T4a>T1).

The first metal mask 4a is made of appropriate metal, for example, nickel (Ni), nickel-cobalt alloy (Ni/Co), or stainless steel. The mask 4a is usually formed by the known additive or etching method. For example, the thickness T4a of the mask 4a is 30 $\mu$m and the diameter D3a of the openings 3a is 150 $\mu$m (i.e., T4a=30 $\mu$m and D3a=150 $\mu$m).

First, the first metal mask 4a is placed on the surface of the chip 2 in such a way that all the openings 3a of the mask 4a are superposed on the corresponding electrodes 1 of the chip 2. At this time, the openings 3a are located to be concentric with their respective electrodes 1. Thus, as shown in FIG. 1A, the lower face of the mask 4a is contacted with the surface of the chip 2 and at the same time, each electrode 1 of the chip 2 is located at the center of the corresponding opening 3a of the mask 4a.

Next, a solder paste 5 is printed on the surface of the chip 2 to have a specific pattern by the screen printing method. Specifically, as shown in FIG. 1A, a specific amount of the solder paste 5 is placed on the upper surface of the first metal mask 4a and then, a squeegee 6 is moved horizontally along the surface of the mask 4a to squeeze the paste 5 into the openings 3a of the mask 4a. Thus, the paste 5 is filled into all the openings 3a.

Figure 1B:
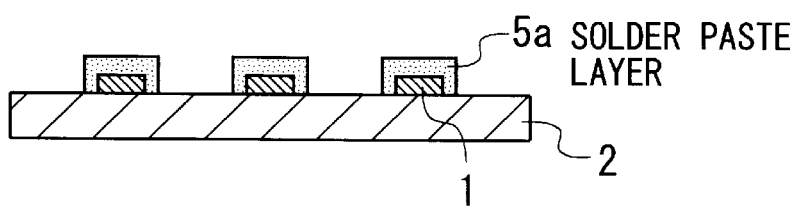

When all the openings 3a are entirely filled with the paste 5, the first metal mask 4a is detached from the chip 2, forming cylindrical solder paste layers 5a. The state at this stage is shown in FIG. 1B. Since the diameter D3a and height T4a of the openings 3a are larger than the diameter D1 and the thickness T1 of the electrodes 1, not only the upper face of each electrode 1 but also the side face thereof are covered with the corresponding solder paste layer 5a, as shown in FIG. 1B.

Following this, the chip 2 on which the solder paste layers 5a have been formed is placed in a reflowing furnace (not shown) and then, it is heated at a specific temperature for a specific period of time. Since the solder paste 5 is produced by mixing and dispersing minute solder particles into a flux made of organic substance, the flux contained in the paste 5 vaporizes and dissipates due to applied heat. On the other hand, due to the heat, the solder particles in the paste 5 are melted and integrated together to form molten solder pieces on the respective electrodes 1. At this time, the molten solder pieces thus formed are naturally rounded at its surface due to their surface tension. The entire upper face of each electrode 1 is covered with the corresponding molten solder piece while the side face thereof is exposed therefrom.

Figure 1C:
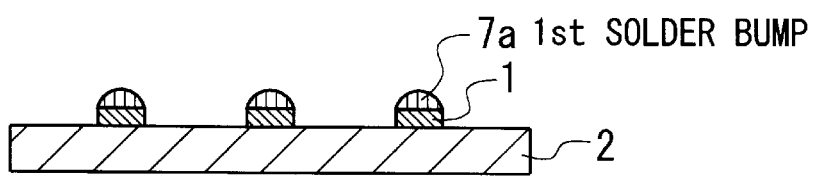
Figure 5:
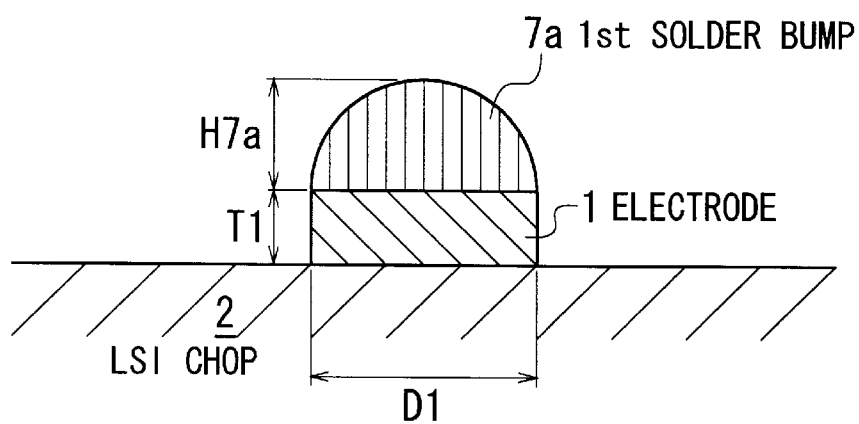
FIG. 5 is an enlarged, schematic, partial cross-sectional view showing the dimensional relationship between the first solder bump and the corresponding electrode of the substrate in the method according to the first embodiment of FIGS. 1A to 1F.

Thereafter, the chip 2 on which the molten solder pieces have been placed on the electrodes 1 is taken out of the furnace and cooled naturally. At this stage, the molten solder pieces on the electrodes 1 solidify as they are without substantial outline change, resulting in first solder bumps 7a on the respective electrodes 1, as shown in FIG. 1C. These solder bumps 7a have the same height H7a from the top face of the electrodes 1 and the same diameter as the diameter D1 of the electrode 1, as shown in FIG. 5.

Here, for example, it is supposed that voids (not shown) to be prevented or suppressed within the first solder bumps 7a have the maximum diameter of 20 $\mu$m. In this case, the height H7a of the bumps 7a is set to be approximately equal to the maximum diameter (i.e., 20 $\mu$m) of the voids. Thus, the voids having diameters greater than 20 $\mu$m can be effectively prevented from occurring in the bumps 7a.

The amount of the solder paste 5 filled into each opening 3a of the first metal mask 4a in the screen printing process is set to be sufficiently smaller than the ordinary amount corresponding to the diameter D1 of the electrodes 1. Therefore, the amount of the molten solder pieces formed on the electrodes 1 in the heating/reflowing process is sufficiently small. As a result, the molten solder pieces on the electrodes 1 do not have a spherical surface but a part of a spherical surface (which may be said to be similar to a plane), as shown in FIG. 1C. Thus, the void defect having diameters greater than approximately 20 $\mu$m is prevented or effectively suppressed. The reason is as follows:

According to the inventor's research, the main cause of the void defect in the first solder bumps 7a is various gaseous substances generated by reaction between the electrodes 1 and the solder paste layer 5a in the heating/reflowing process. When the molten solder piece on each electrode 1 solidifies after the heating/reflowing process is completed, the gaseous substances are likely to be confined in the first solder bump 7a on the electrode 1 and as a result, a hollow space tends to be formed in the bump 7a. The hollow space in the bump 7a will form a void defect. The more similar to a sphere the bump 7a is, the easier the gaseous substances are confined in the bump 7a, i.e., the higher the possibility of the void defect becomes. Moreover, the more similar to a sphere the bump 7a is, the larger the possible size of the void defect grows. This means that the more dissimilar to a sphere (in other words, the more similar to a plane) the bump 7a is, the lower the possibility of the void defect is and at the same time, the smaller the possible size of the void is.

As explained above, with the method of forming solder bumps of the first embodiment, the height H7a of the first solder bumps 7a is set to be approximately equal to the maximum size (i.e., 20 μm) of the voids to be prevented or suppressed. The maximum size of the voids has been determined while taking the diameter D1 of the electrodes 1 into consideration. Therefore, even if hollow spaces or cavities are formed in the respective first solder bumps 7a due to the gaseous substances, the spaces or cavities having approximately equal size to the maximum void size will burst easily and disappear. None of these spaces or cavities is left in the respective bumps 7a. Needless to say, hollow spaces or cavities having smaller than the maximum void size may be left in the respective bumps 7a. However, if the maximum void size is determined at an appropriate value, it is easy to prevent such the smaller spaces or cavities from causing practical problems. As a consequence, the void defect is effectively suppressed or prevented in the process step of forming the bumps 7a.

Figure 1D:
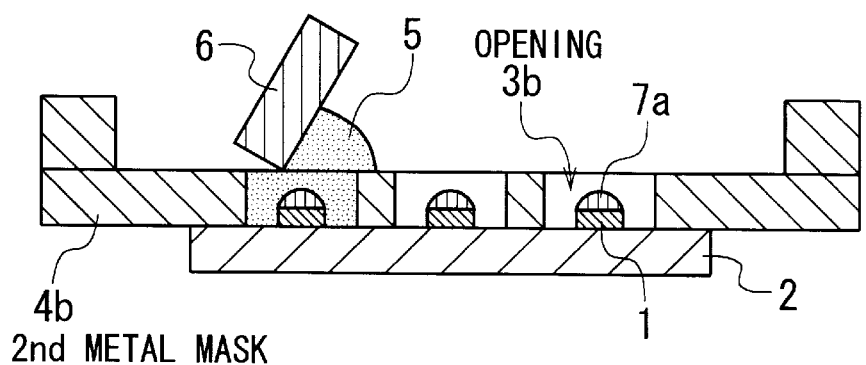

After the first solder bumps 7a are formed on the respective electrodes 1 of the chip 2 through the above-described process steps, a screen printing process is carried out again using a second metal mask 4b in the same way as the first screen printing process, as shown in FIG. 1D.

Figure 6:
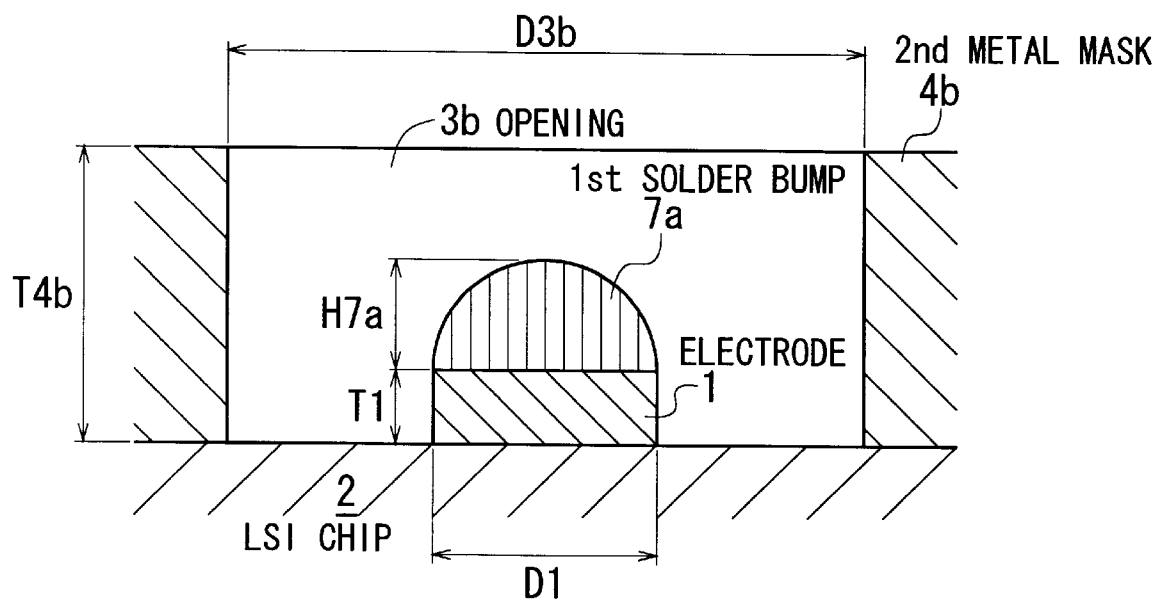
FIG. 6 is an enlarged, schematic, partial cross-sectional view showing the dimensional relationship between the opening of the second metal mask and the first solder bump in the method according to the first embodiment of FIGS. 1A to 1F.

The second metal mask 4b has circular openings 3b at the corresponding locations to the electrodes 1, which is similar to the first metal mask 4a. These openings 3b are arranged according to the same layout as the electrodes 1. As shown in FIG. 6, the diameter D3b of each opening 3b is larger than the diameter D1 of the corresponding electrode 1 (i.e., D3b>D1) while the thickness T4b of the mask 4b (i.e., the height of the openings 3b) is larger than the thickness T1 of the electrodes 1 (i.e., T4b>T1). Furthermore, the thickness T4b of the second mask 4b is larger than the thickness T4a of the first mask 4a (i.e., T4b>T4a).

The second mask 4b is made of metal, for example, nickel (Ni), nickel-cobalt alloy (Ni/Co), or stainless steel and usually formed by the known additive or etching method. This is similar to the first mask 4a. For example, the thickness T4b of the mask 4b is 80 μm and the diameter D3b of the openings 3b is 180 μm.

In the second screen printing process, as shown in FIG. 1D, the second mask 4b is placed on the surface of the chip 2 in such a way that the openings 3b of the mask 4b are superposed on the respective electrodes 1 (the corresponding first bumps 7a) of the chip 2. At this time, the openings 3b are placed to be concentric with their respective electrodes 1 and the bump 7a. Thus, as shown in FIG. 1D, the lower face of the mask 4b is contacted with the surface of the chip 2 and each electrode 1 or bump 7a is located at the center of the corresponding opening 3a of the mask 4b.

Thereafter, a solder paste 5 is printed on the surface of the chip 2 to have a specific pattern using the second mask 4b. Specifically, as shown in FIG. 1D, a specific amount of the paste 5 is placed on the upper surface of the second mask 4b and then, the squeegee 6 is moved horizontally along the surface of the mask 4b, filling the paste 5 into the openings 3b of the mask 4b.

Figure 1E:
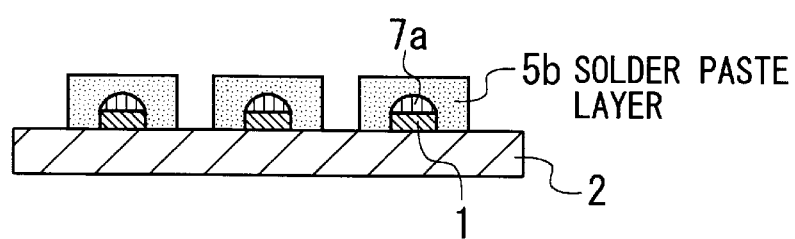

When all the openings 3b are entirely filled with the paste 5, the second mask 4b is detached from the chip 2. The state at this stage is shown in FIG. 1E. The diameter D3b of the openings 3b of the mask 4b is larger than the diameter D1 of the electrodes 1 and at the same time, the thickness T4b of the mask 4b is larger than the sum of the thickness T1 of the electrodes 1 and the height H7a of the first solder bumps 7a (i.e., D3b>D1, T4b>T1+H7a). Therefore, not only the round face of each bump 7a but also the side face of the corresponding electrode 1 are covered with a cylindrical solder paste layer 5b, as shown in FIG. 1E.

Following this, the chip 2 on which the solder paste layers 5b have been formed is moved into the same furnace (not shown) as above and then, it is heated at a specific temperature for a specific period of time. Due to applied heat, the flux contained in the solder paste layer Sb vaporizes and dissipates while the solder particles in the layer 5b are melted and integrated with the corresponding first solder bump 7a, forming a molten solder piece on each of the electrodes 1. At this time, the molten solder pieces thus formed are naturally rounded at their surfaces due to their surface tension.

Figure 1F:
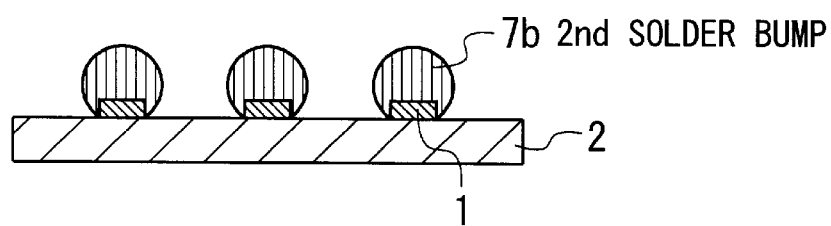

Thereafter, the chip 2 on which the molten solder pieces have been placed on the electrodes 2 is taken out of the reflowing furnace and cooled naturally. At this stage, the molten solder pieces on the electrodes 2 solidify as they are without substantial outline change, resulting in second solder bumps 7b on the electrodes 1, as shown in FIG. 1F. Each of the bumps 7b thus formed is approximately spherical and covers approximately entirely the top and side faces of the corresponding electrode 1.

Figure 7:
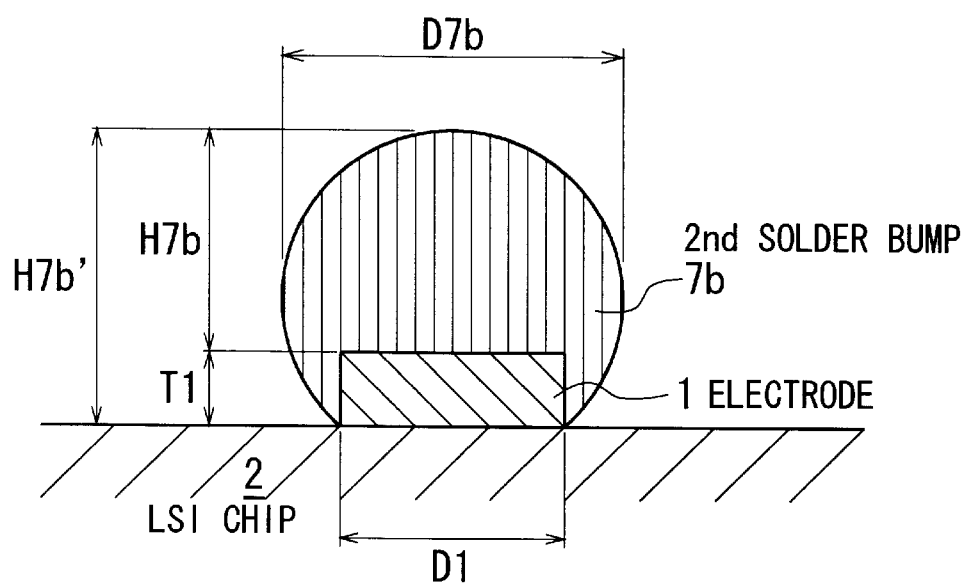
FIG. 7 is an enlarged, schematic, partial cross-sectional view showing the dimensional relationship between the second solder bump and the corresponding electrode of the substrate in the method according to the first embodiment of FIGS. 1A to 1F.

As clearly shown in FIG. 7, the second solder bumps 7b have the same height H7b from the top face of the corresponding electrodes 1 and the same diameter D7b. However, the diameter D7b of the bumps 7b is larger than the diameter D1 of the electrodes 1 (i.e., D7b>D1). The height H7b' of the second bumps 7b from the surface of the chip 2 is equal to the sum of the height H7b and the thickness T1 of the electrodes 1 (i.e., H7b'=H7b+T1).

For example, if the height H7a of the first bumps 7a is 20 μm, the height H7b of the second bumps 7b is 80 μm.

With the method of forming solder bumps according to the first embodiment of the invention, as described above in detail, the volume of each opening 3a of the first metal mask 4a is set in such a way that the height H7a of the first solder bumps 7a is approximately equal to the maximum size (e.g., 20 μm) of the void defect to be prevented or suppressed. Therefore, even if gaseous substances are generated due to thermal reaction between the first solder paste layer 5a and the electrodes 1 in the first heating/reflowing process, these substances are difficult to be confined in the first solder bumps 7a. Accordingly, the bumps 7b having the height H7b equal to a desired value (e.g., 80 μm) is formed on the electrodes 1 while preventing effectively the occurrence of the void defect.

Moreover, the method of the first embodiment does not require any additional process steps and any special printing condition of solder paste and therefore, it can be easily carried out.

In the method of the first embodiment, the first and second metal masks 4a and 4b are used. However, any masks made of any other material than metal (e.g., resist masks) may be used instead. Although the openings 3b of the second metal mask 4b are circular and have a diameter of 180 μm in the first embodiment, it was found that the same result could be given if the openings 3b of the second metal mask 4b are square and have a side of 180 μm.

Furthermore, to further raise a desired height of resultant solder bumps, a third mask (and fourth, fifth, . . . n-th masks) may be used to perform the same screen-printing/reflowing processes as explained above, according to the necessity. In this case, the first and second screen-printing/reflowing processes are repeated three times or more.

Second Embodiment

FIGS. 2A to 2E show a method of forming solder bumps according to a second embodiment, in which first and second resist masks 14a and 14b are used instead of the first and second metal masks 4a and 4b in the first embodiment. Each of the first and second resist masks 14a and 14b is usually formed by patterning a photoresist film. Since the same LSI chip 2 as used in the first embodiment is used in the second embodiment, the explanation on the chip 2 is omitted here.

Figure 2A:
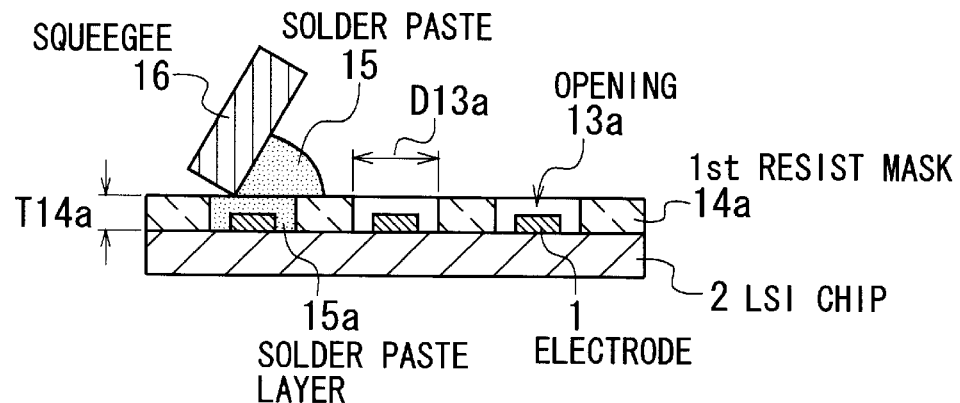
FIGS. 2A to 2E are schematic, partial cross-sectional views showing the process steps of a method of forming solder bumps according to a second embodiment of the invention, respectively.

The first resist mask 14a has circular openings 13a at the corresponding locations to the electrodes 1 of the chip 2. The openings 13a are arranged according to the same layout as the electrodes 1. As shown in FIG. 2A, the diameter D13a of each opening 13a is larger than the diameter D1 of the corresponding electrode 1 (i.e., D13a>D2) while the thickness T14a of the mask 14a (i.e., the height of the openings 13a) is larger than the thickness T1 of the electrodes 1 (i.e., T14a>T1).

First, the first resist mask 14a is placed on the surface of the chip 2 in such a way that the openings 13a of the mask 14a are superposed on the respective electrodes 1 of the chip 2. At this time, the openings 13a are placed to be concentric with their respective electrodes 1. Thus, as shown in FIG. 2A, the lower face of the mask 14a is contacted with the surface of the chip 2 and each electrode 1 is located at the center of the corresponding opening 13a of the mask 14a.

Next, a solder paste 15 is printed on the surface of the chip 2 to have a specific pattern by the screen printing method. Specifically, as shown in FIG. 2A, a specific amount of the paste 15 is placed on the upper surface of the first resist mask 14a and then, a squeegee 16 is moved horizontally along the surface of the mask 14a, filling the paste 15 into the respective openings 13a of the mask 14a. When all the openings 13a are entirely filled with the paste 15 this way, not only the top face of each electrode 1 but also the side face thereof are covered with a cylindrical solder paste layer 15a. This is because the diameter D13a and the height T14a of the openings 13a are larger than the diameter D1 and the thickness T1 of the electrodes 1, respectively.

The above-described process steps are the same as those in the first embodiment.

Subsequently, without detaching the first resist mask 14a from the chip 2 (which is unlike the first embodiment), the chip 2 on which the solder paste layers 15a have been formed is place in a reflowing furnace (not shown) and then, it is heated at a specific temperature for a specific period of time. Thus, the flux contained in the solder paste 5 vaporizes and dissipates while the solder particles in the paste 5 are melted and integrated together to form molten solder pieces on the respective electrodes 1. At this time, the molten solder pieces thus formed are naturally rounded at their surfaces due to their surface tension. In this heating/reflowing process, the heating temperature of the furnace is set to be lower than the highest operable temperature of the first resist mask 14a, or the mask 14a is made of a material whose highest operable temperature is higher than the heating temperature of the furnace.

Figure 2B:
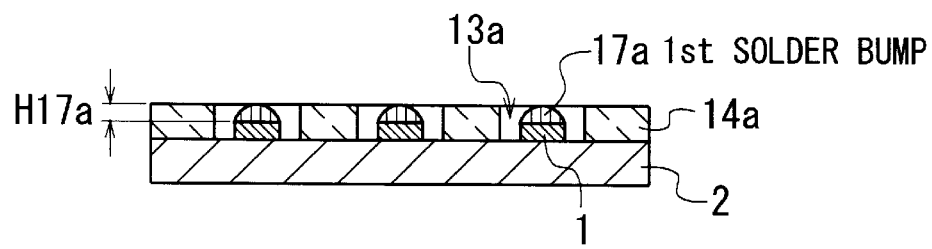

Thereafter, the chip 2 on which the molten solder pieces have been placed on the respective electrodes 1 is taken out of the furnace and cooled naturally. At this stage, the molten solder pieces on the electrodes 1 solidify as they are without substantial outline change, resulting in first solder bumps 17a on the respective electrodes 1, as shown in FIG. 2B. These solder bumps 17a have the same height H17a from the top face of the corresponding electrodes 1 and approximately the same diameter as the diameter D1 of the electrode 1.

The amount of the solder paste 15 filled into the openings 13a of the first resist mask 14a in the first screen printing process is set to be sufficiently smaller than the ordinary amount corresponding to the diameter D1 of the electrodes 1. Therefore, the amount of the molten solder pieces formed on the respective electrodes 1 in the first heating/reflowing process is sufficiently small. As a result, each of the molten solder pieces does not have a spherical surface but a part of a spherical surface (which may be said to be similar to a plane). Thus, because of the same reason as described in the first embodiment, the void defect having diameters greater than the specific value (e.g., 20 μm) is prevented or effectively suppressed.

As explained above, with the method of forming solder bumps of the second embodiment, the height H17a of the first solder bumps 17a is set to be approximately equal to the maximum size (i.e., 20 μm) of the void defect to be prevented or suppressed. The maximum size of the void defect has been determined while taking the diameter D1 of the electrodes 1 into consideration. Therefore, even if hollow spaces or cavities are formed in the bumps 17a due to the gaseous substances, the spaces or cavities having approximately equal size to the maximum void size (e.g., 20 μm) will burst easily and disappear. None of these spaces or cavities is left in each of the bumps 17a. As a consequence, the void defect is prevented or effectively suppressed during the process step of forming the bumps 17a.

Figure 2C:
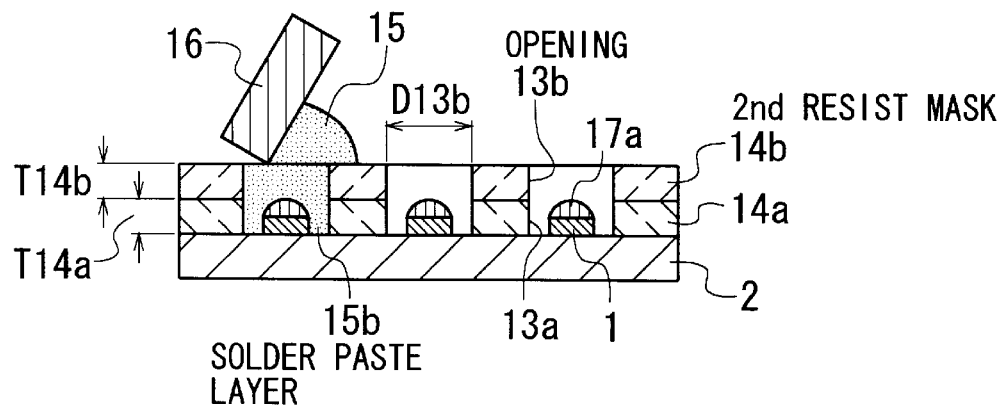

After the first solder bumps 17a are formed on the respective electrodes 1 through the above-described process steps, Be a second resist mask 14b is formed on the first resist mask 14a, as shown in FIG. 2C. Unlike the first embodiment, the first resist mask is not detached from the substrate 2 at this time. Then, a second screen printing process is carried out using both the first and second resist masks 14a and 14b in the same way as the first screen printing process.

The second mask 14b has the same pattern as the first mask 14a. The circular openings 13b of the second mask 14b have a diameter D13b equal to the diameter D13a of the first mask 14a (i.e., D13b=D13a). The second mask 14b has a thickness T14b equal to the thickness T14a of the first mask 14a (i.e., T14b=T14a).

In the second screen printing process using both the first and second masks 14a and 14b thus stacked, as shown in FIG. 2C, the solder paste 15 is printed on the surface of the second mask 14b to have a specific pattern. Specifically, as shown in FIG. 2C, a specific amount of the paste 15 is placed on the upper surface of the second mask 14b and then, the squeegee 16 is moved horizontally along the surface of the mask 14b, filling the paste 15 into the openings 13a and 13b of the masks 14a and 14b.

When all the openings 13a and 13b are entirely filled with the paste 15, the sum of the thicknesses T14a and T14b of the masks 14a and 14b is larger than the sum of the thickness T1 of the electrodes 1 and the height H17a of the first solder bumps 17a, i.e., (T14a+T14b)>(T1+H17a). Therefore, not only the upper face of each of the first bumps 17a but also the side face thereof are covered with a solder paste layer 15b, as shown in FIG. 2C.

Following this, the chip 2 on which the solder paste layers 15b have been formed is moved into the same furnace (not shown) without detaching the masks 14a and 14b and then, it is heated at a specific temperature for a specific period of time. Due to applied heat, the flux contained in the paste layers 15b vaporizes and dissipates while the solder particles in the layers 15b are melted and integrated with the corresponding bumps 17a to form molten solder pieces. At this time, the molten solder pieces thus formed are naturally rounded at their surfaces due to their surface tension. In this second heating/reflowing process, the heating temperature of the furnace is set to be lower than the highest operable temperature of the resist masks 14a and 14b, or the masks 14a and 14b are made of a material or materials whose highest operable temperature is/are higher than the heating temperature of the furnace.

Figure 2D:
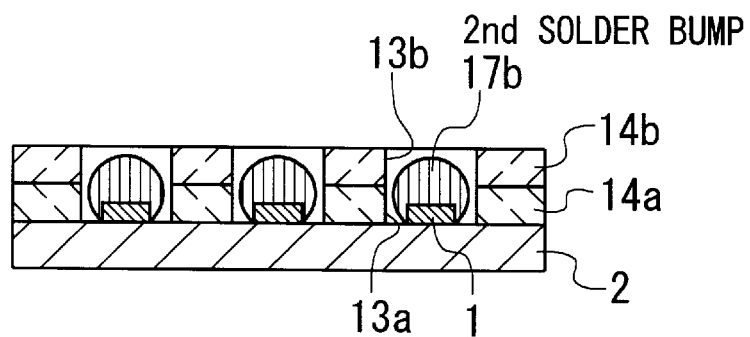

Thereafter, the chip 2 on which the molten solder pieces have been placed on the respective electrodes 2 is taken out of the furnace and cooled naturally. At this stage, the molten solder pieces on the respective electrodes 2 solidify as they are without substantial outline change, resulting in second solder bumps 17b on the respective electrodes 1, as shown in FIG. 2D. Each of the bumps 17b thus formed is approximately spherical and covers approximately entirely the top and side faces of the corresponding electrode 1.

Figure 2E:
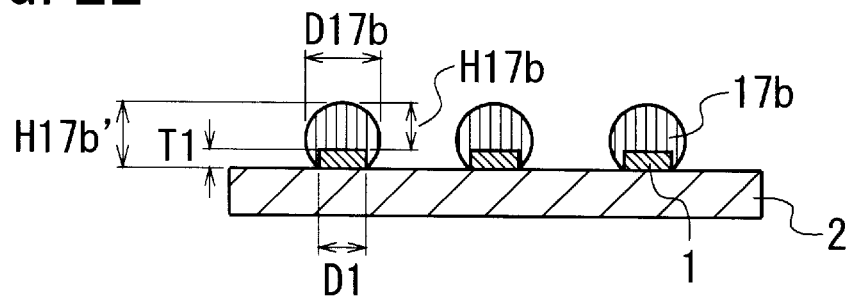

Finally, the first and second masks 14a and 14b are detached from the substrate 2, resulting in the approximately spherical solder bumps 17b with a desired height on the respective electrodes 1, as shown in FIG. 2E.

As shown in FIG. 2E, the second solder bumps 17b thus formed have the same height H17b from the top faces of the respective electrodes 1. The bumps 17b have the same diameter D17b larger than the diameter D1 of the electrodes 1. The bumps 17b have the same height H17b' from the surface of the chip 2, which is equal to the sum of the height H17b and the thickness T1 of the electrode 1 (i.e., H17b'= H17b+T1).

With the method of forming solder bumps according to the second embodiment of the invention, as described above in detail, the volume of each openings 13a of the first resist mask 14a is determined in such a way that the height H17a of the first solder bumps 17a is approximately equal to the maximum size (e.g., 20 µm) of the void defect to be prevented or suppressed. Therefore, even if gaseous substances are generated due to thermal reaction between the first solder paste layers 15a and the electrodes 1, these substances are difficult to be confined in the solder bumps 17a. Accordingly, the solder bumps 17b having the height H17b equal to a desired value (e.g., 20 µm) is formed on the respective electrodes 1 while preventing effectively the occurrence of the void defect.

Moreover, the method of the second embodiment does not require any additional process steps and any special printing condition of solder paste and therefore, it can be easily carried out.

Although the second solder bumps 27b have the desired height in the method of the second embodiment, to further raise the height of the solder bumps, a third mask (and fourth, fifth, . . . n-th masks) may be used to perform the same screen printing and reflowing processes as explained above, according to the necessity. In this case, the screen printing and heating/reflowing processes are repeated three times or more.

Third Embodiment

FIGS. 3A to 3D show a method of forming solder bumps according to a third embodiment, in which the first and second screen printing processes using the first and second metal masks 4a and 4b in the first embodiment are not performed. Instead, first and second placement processes of placing first and second solder balls 32a and 32b on or over the electrodes 1 using a known attraction tool 31 are carried out. Since the same LSI chip 2 as used in the first embodiment is used in the third embodiment, the explanation on the chip 2 is omitted here.

Figure 3A:
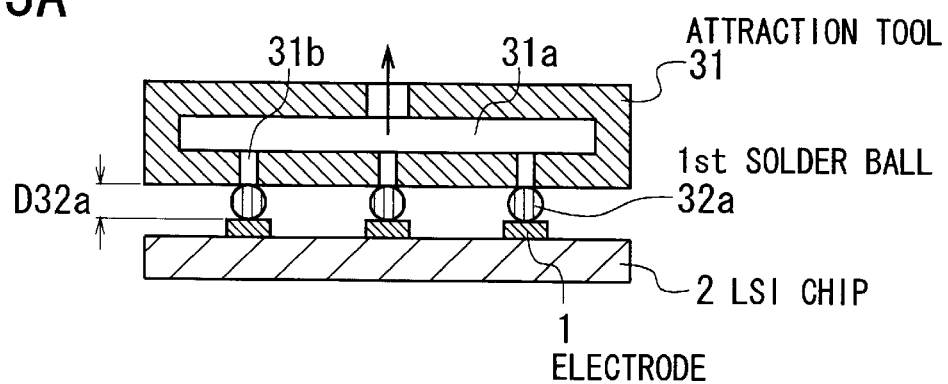
FIGS. 3A to 3D are schematic, partial cross-sectional views showing the process steps of a method of forming solder bumps according to a third embodiment of the invention, respectively.

In the method of the third embodiment, the first solder balls 32a, which are formed by a known method, are placed on the respective electrodes 2 of the chip 1 and applied with a specific pressing force using the attraction tool 31, as shown in FIG. 3A. Thus, the balls 32a are attached onto the respective electrodes 1. The balls 32a have the same diameter D32a.

The tool 31 comprises an inner space 31a and penetrating holes 31b communicated with the space 31a. The holes 31a are arranged on the bottom surface of the tool 31 in such a way as to be superposed on their respective electrodes 1. The space 31a is kept at a specific vacuum level (i.e., a specific pressure) with a vacuum pump on operation, thereby generating specific attracting forces at the holes 31b. The first solder balls 32a are attracted at the holes 31b by the attraction forces thus generated and then, they are placed and fixed onto the respective electrodes 1 with the tool 31, as shown in FIG. 3A.

Next, the chip 2 with the first solder balls 32a on the electrodes 1 is placed in a reflowing furnace (not shown) and then, it is heated at a specific temperature for a specific period of time. Thus, the balls 32a are melted to be molten solder pieces. At this time, the molten solder pieces thus formed are naturally rounded at their surfaces due to their surface tension.

Figure 3B:
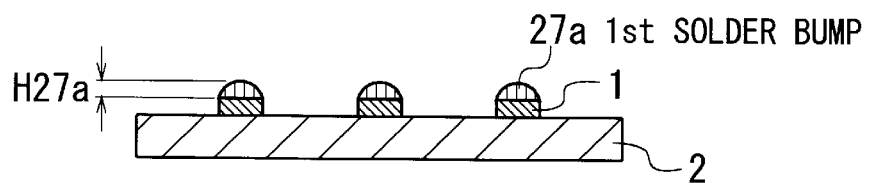

Thereafter, the chip 2 on which the molten solder pieces have been placed on the electrodes 1 is taken out of the furnace and cooled naturally. At this stage, the molten solder pieces on the electrodes 1 solidify as they are without substantial outline change, resulting in first solder bumps 27a on the respective electrodes 1, as shown in FIG. 3B. These solder bumps 27a have the same height H27a from the top faces of the respective electrodes 1 and approximately the same diameter as the diameter D1 of the electrodes 1.

The diameter D32a of the first solder balls 32a is set to be sufficiently smaller than the diameter D1 of the electrodes 1 and therefore, the amount of the molten solder pieces formed on the electrodes 1 in the heating/reflowing process is sufficiently small. As a result, each solder bump 27a does not have a spherical surface but a part of a spherical surface (which may be said to be similar to a plane), as shown in FIG. 3B. Thus, because of the same reason as described in the first embodiment, the void defect having diameters greater than the specific value (e.g., 20 µm) is prevented or effectively suppressed in the bumps 27a.

Figure 3C:
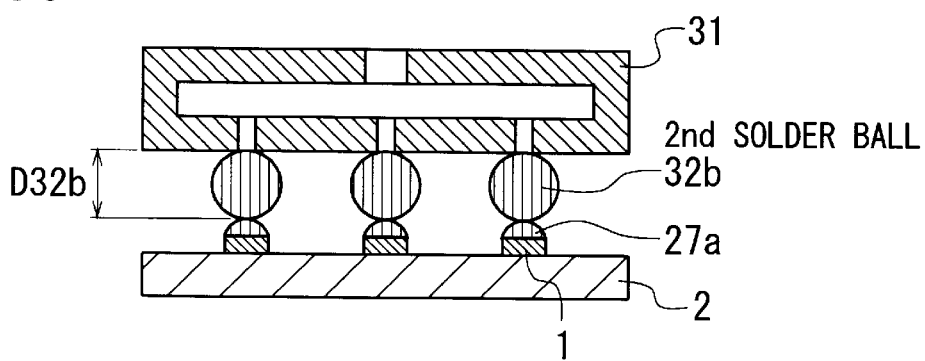

After the first solder bumps 27a are formed on the respective electrodes 1 through the above-described process steps, second solder balls 32b are placed on the respective bumps 27a and applied with a specific pressing force using the same attraction tool 31, as shown in FIG. 3C. Thus, the balls 32b are attached to the tops of the respective bumps 27a. The balls 32b have the same diameter D32b.

Next, the chip 2 with the second solder balls 32b on the respective bumps 27a is placed in the same furnace and then, it is heated at a specific temperature for a specific period of time. Thus, the balls 32b are melted to be integrated with the bumps 27a, forming molten solder pieces on the respective electrodes 1. At this time, the molten solder pieces thus formed are naturally rounded at their surfaces due to their surface tension.

Figure 3D:
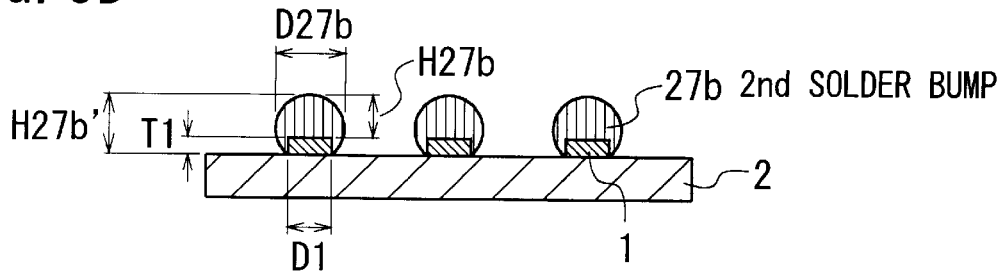

Thereafter, the chip 2 on which the molten solder pieces have been placed on the respective electrodes 1 is taken out of the furnace and cooled naturally. At this stage, the molten solder pieces on the electrodes 1 solidify as they are without substantial outline change, resulting in second solder bumps 27b on the respective electrodes 1, as shown in FIG. 3D. These solder bumps 27b have the same height H27b from the top faces of the respective electrodes 1 and the same diameter D27b larger than the diameter D1 of the electrodes 1. The bumps 27b are approximately sphere and cover their respective electrodes 1 approximately entirely.

The height H27b of the second solder bumps 27b thus formed is greater than the diameter D1 of the electrodes 1. The height H27b' of the bumps 27b from the surface of the chip 2 is equal to the sum of the height H27b of the bumps 27b and the thickness T1 of the electrodes 1 (i.e., H27b'= H27b+T1).

With the method of forming solder bumps according to the third embodiment of the invention, as described above, the diameter D32a of the first solder balls 32a is determined in such a way that the height H27a (i.e., the volume) of the first solder bumps 27a is approximately equal to the maximum size (e.g., 20 μm) of the voids to be prevented or suppressed. Therefore, even if gaseous substances are generated due to thermal reaction between the balls 32a and the electrodes 1 in the first hating/reflowing process, these substances are difficult to be confined in the first solder bumps 27a. Accordingly, the second solder bumps 27b whose height H27b is equal to the desired value can be formed on the respective electrodes 1 while preventing effectively the occurrence of the void defect.

Moreover, the method of the third embodiment does not require any additional process steps and any special printing condition of solder paste and therefore, it can be easily carried out.

In the method of the third embodiment also, to further raise a desired height of resultant solder balls, third solder balls (and fourth, fifth, . . . n-th solder balls) may be used to form desired solder bumps according to the necessity. In this case, the solder-ball placement and the heating/reflowing processes are repeated three times or more.

VARIATIONS

Needless to say, the invention is not limited to the above-described first to third embodiments. Any change may be added to these embodiments within the spirit of the invention.

For example, in the above-described embodiments, the electrodes of a LSI bare chip are circular and have the same diameter and the same thickness as each other. However, the invention is not limited to these cases. The electrodes may be square or any other shape than circular. The electrodes may have different shapes and different sizes from each other according to the necessity. In this case, the shape and/or size of the openings of masks used are appropriately determined corresponding to the shape and size of the electrodes.

Although the method of the invention is applied to the formation of solder bumps for LSI chips, it may be applied to the formation of solder bumps for any substrate (e.g., PWBs) having electrodes or pads other than the substrate of a LSI chip.

While the preferred forms of the present invention has been described, it is to be understood that modifications will be apparent to those skilled in the art without departing from the spirit of the invention. The scope of the present invention, therefore, is to be determined solely by the following claims.

What is claimed is:

1. A method of forming solder bumps, comprising the steps of:
   (a) forming first solder paste layers on respective electrodes or pads of a substrate by printing a solder paste to have a specific pattern on the electrodes or pads using a first mask with openings;
   (b) forming first solder bumps on the respective electrodes or pads of the substrate by melting the first solder paste layers due to heat for a while and by solidifying the first solder paste layers thus melted, after removing the first mask from the substrate;
   (c) forming second solder paste layers on the respective first solder bumps over the electrodes or pads of the substrate by printing a solder paste to have a specific pattern on the first solder bumps using a second mask with openings; and
   (d) forming second solder bumps on the respective electrodes or pads of the substrate by melting the first solder bumps and the second solder paste layers due to heat for a while to be integrated together and by solidifying the first solder bumps and the second solder paste layers thus melted and integrated, after removing the second mask from the substrate;
   the second solder bumps being larger than the first solder bumps;
   wherein each of the openings of the first mask has a volume in such a way that each of the first solder bumps has a height approximately equal to maximum size of a void to be suppressed according to size of a corresponding one of the electrodes or pads.

2. The method according to claim 1, wherein the first mask is thicker than the electrodes or pads of the substrate while the openings of the first mask are larger than the electrodes;
   and wherein the second mask is thicker than the first mask while the openings of the second mask are larger than the corresponding openings of the first mask.

3. The method according to claim 1, wherein the second solder bumps cover not only top faces of the respective electrodes or pads but also side faces thereof.

4. The method according to claim 1, wherein each of the openings of the second mask has a volume in such a way that each of the second solder bumps has a height equal to a desired value.

5. A method of forming solder bumps, comprising the steps of:
   (a) forming first solder paste layers on respective electrodes or pads of a substrate by printing a solder paste to have a specific pattern on the electrodes or pads using a first mask with openings;

(b) forming first solder bumps on the respective electrodes or pads of the substrate by melting the first solder paste layers due to heat for a while and solidifying the first solder paste layers thus melted, without removing the first mask from the substrate;

(c) forming a second mask with openings on the first mask;

(d) forming second solder paste layers on the respective first solder bumps over the electrodes or pads of the substrate by printing a solder paste to have a specific pattern on the first solder bumps using the second mask;

(e) forming second solder bumps on the respective electrodes or pads of the substrate by melting the first solder bumps and the second solder paste layers due to heat for a while to be integrated together and by solidifying the first solder bumps and the second solder paste layers thus melted and integrated, without removing the first and second masks from the substrate;

the second solder bumps being larger than the first solder bumps; and (f) removing the second and first masks from the substrate after the step (e);

wherein each of the openings of the first mask has a volume in such a way that each of the first solder bumps has a height approximately equal to maximum size of a void to be suppressed according to size of a corresponding one of the electrodes or pads.

6. The method according to claim 5, wherein the first mask is thicker than the electrodes or pads of the substrate while the openings of the first mask are larger than the corresponding electrodes or pads;

and wherein the openings of the second mask are approximately equal in size to the corresponding openings of the first mask.

7. The method according to claim 5, wherein the second solder bumps cover not only top faces of the respective electrodes or pads but also side faces thereof.

8. The method according to claim 5, wherein sum of each of the openings of the second mask and a corresponding one of the openings of the first mask has a volume in such a way that each of the second solder bumps has a height equal to a desired value.

9. A method of forming solder bumps, comprising the steps of:

(a) placing first solder balls on respective electrodes or pads of a substrate;

(b) forming first solder bumps on the respective electrodes or pads of the substrate by melting the first solder balls due to heat for a while and by solidifying the first solder balls thus melted;

(c) placing second solder balls on the respective first solder bumps over the electrodes or pads of the substrate; and (d) forming second solder bumps on the respective electrodes or pads of the substrate by melting the first solder bumps and the second solder balls due to heat for a while to be integrated together and by solidifying the first solder bumps and the second solder balls thus melted and integrated;

the second solder bumps being larger than the first solder bumps;

wherein each of the first solder balls has a volume in such a way that each of the first solder bumps has a height approximately equal to maximum size of a void to be suppressed according to size of a corresponding one of the electrodes or pads.

10. The method according to claim 9, wherein the second solder balls are larger in diameter than the corresponding electrodes or pads of the substrate.

11. The method according to claim 9, wherein the second solder bumps cover not only top faces of the respective electrodes or pads but also side faces thereof.

12. The method according to claim 9, wherein each of the second solder balls has a volume in such a way that each of the second solder bumps has a height equal to a desired value.

* * * * *